United States Patent
Widman et al.

(10) Patent No.: US 8,810,784 B2
(45) Date of Patent: Aug. 19, 2014

(54) METHOD AND APPARATUS FOR DETERMINING A THICKNESS PROFILE OF AN OPHTHALMIC LENS USING A SINGLE POINT THICKNESS AND REFRACTIVE INDEX MEASUREMENTS

(71) Applicant: Johnson & Johnson Vision Care, Inc., Jacksonville, FL (US)

(72) Inventors: Michael Widman, Jacksonville, FL (US); Naveen Agarwal, Jacksonville, FL (US); Christopher Wildsmith, Jacksonville, FL (US); Peter W Sites, Orange Park, FL (US)

(73) Assignee: Johnson & Johnson Vision Care Inc., Jacksonville, FL (US)

( * ) Notice: Subject to any disclaimer, the term of this patent is extended or adjusted under 35 U.S.C. 154(b) by 0 days.

(21) Appl. No.: 13/764,499

(22) Filed: Feb. 11, 2013

(65) Prior Publication Data

US 2013/0208265 A1    Aug. 15, 2013

Related U.S. Application Data

(60) Provisional application No. 61/597,343, filed on Feb. 10, 2010, provisional application No. 61/597,338, filed on Feb. 10, 2010.

(51) Int. Cl.
*G01B 9/00* (2006.01)
*G03F 7/20* (2006.01)
*G01M 11/02* (2006.01)

(52) U.S. Cl.
CPC ........... *G03F 7/706* (2013.01); *G01M 11/0235* (2013.01)
USPC ........................................... 356/124; 705/27

(58) Field of Classification Search
CPC ....................................................... G03F 7/706
USPC .................................... 705/27; 356/128, 124
See application file for complete search history.

(56) References Cited

U.S. PATENT DOCUMENTS

| | | | |
|---|---|---|---|
| 3,804,523 | A | 4/1974 | McCormack |
| 4,403,420 | A | 9/1983 | Rarick |
| 5,024,527 | A | 6/1991 | Harrison |

(Continued)

FOREIGN PATENT DOCUMENTS

| | | |
|---|---|---|
| DE | 3934744 A1 | 4/1991 |
| DE | 19806446 A1 | 8/1999 |

(Continued)

OTHER PUBLICATIONS

PCT International Search Report, dated Jun. 6, 2013, for PCT Int'l Appln. No. PCT/US2013/025094.

(Continued)

*Primary Examiner* — Tarifur Chowdhury
*Assistant Examiner* — MD Rahman

(57) ABSTRACT

This invention provides for a method and an ophthalmic lens thickness profile measuring apparatus. More specifically, the apparatus which is capable of measuring the ophthalmic lens in a precursor state after it is free-formed on an optic forming mandrel on which it can be formed. Additionally, the present invention can also allow for a design profile of the formed ophthalmic lens to be compared to the resulting free-formed ophthalmic lens to ensure it meets specified convergence design criteria.

4 Claims, 6 Drawing Sheets

(56) References Cited

U.S. PATENT DOCUMENTS

| | | | |
|---|---|---|---|
| 5,280,336 A | 1/1994 | Fantone et al. | |
| 5,500,732 A | 3/1996 | Ebel et al. | |
| 5,717,781 A | 2/1998 | Ebel et al. | |
| 5,812,254 A | 9/1998 | Ebel et al. | |
| 6,937,328 B2 | 8/2005 | Fukuma et al. | |
| 7,433,027 B2 | 10/2008 | Hall | |
| 7,905,594 B2 | 3/2011 | Widman et al. | |
| 8,157,373 B2 | 4/2012 | Widman et al. | |
| 8,313,828 B2 | 11/2012 | Widman et al. | |
| 8,317,505 B2 | 11/2012 | Widman et al. | |
| 8,318,055 B2 | 11/2012 | Widman et al. | |
| 2004/0190428 A1 | 9/2004 | Ito et al. | |
| 2008/0052194 A1* | 2/2008 | Shinohara et al. | 705/27 |
| 2009/0174863 A1 | 7/2009 | Widman et al. | |
| 2011/0116081 A1* | 5/2011 | Sugimoto | 356/128 |
| 2011/0134438 A1 | 6/2011 | Kato | |
| 2012/0080811 A1 | 4/2012 | Widman et al. | |
| 2012/0187590 A1 | 7/2012 | Widman et al. | |
| 2012/0258187 A1 | 10/2012 | Widman et al. | |
| 2013/0075577 A1 | 3/2013 | Widman et al. | |

FOREIGN PATENT DOCUMENTS

| | | | |
|---|---|---|---|
| EP | 0357905 | A2 | 3/1990 |
| EP | 0769689 | A2 | 4/1997 |
| EP | 0890414 | A2 | 1/1999 |
| EP | 2048472 | A1 | 4/2009 |
| FR | 2251021 | | 6/1975 |
| GB | 2278193 | A | 11/1994 |
| GB | 2337815 | A | 12/1999 |
| JP | 2003279440 | A | 10/2003 |
| WO | WO 8802846 | A1 | 4/1988 |
| WO | WO 2007018118 | A1 | 2/2007 |
| WO | WO 2008052701 | A1 | 5/2008 |
| WO | WO 2009/025848 | A2 | 2/2009 |

OTHER PUBLICATIONS

PCT International Search Report, dated Jul. 10, 2013, for PCT Int'l Appln. No. PCT/US2013/025077.

PCT International Search Report, dated Mar. 19, 2012, for PCT Int'l. Appln. No. PCT/US2011/062403.

PCT International Search Report, dated Mar. 16, 2012, for PCT Int'l. Appln. No. PCT/US2011/062408.

U.S. Appl. No. 14/062,728, filed Oct. 24 2013—Johnson & Johnson Vision Care, Inc.

* cited by examiner

FIG. 3

Getwave version 1.0.8

| Design | Date | Lens # | Aperture | measured lens Filtered | median RI | x-tilt | y-tilt | x-shift | y-shift | RMS (microns) | PTV (microns) | Radius (mm) |
|---|---|---|---|---|---|---|---|---|---|---|---|---|
| AV2-3D, Trial 115 | 6/1/2010 | 4 | 4 | Y | 1.59588 | -0.0015 | 0.000044 | 4.705 | -0.7025 | 0.411 | 2.559 | 2.659 |
| | 6/1/2010 | 5 | 5 | Y | 1.61952 | 0.00048 | 0.000628 | -1.44642 | 1.65825 | 0.289384 | 1.86868 | 2.6481 |
| | 6/1/2010 | 10 | 6 | Y | 1.59887 | 0.003272 | -0.00014 | -19.8138 | 3.23435 | 0.29739 | 2.13963 | 2.68453 |
| | 6/1/2010 | 4 | 6 | Y | 1.59847 | 0 | 0 | 0 | 0 | 1.13709 | 4.75774 | 2.65944 |
| | 6/1/2010 | 5 | 6 | Y | 1.61636 | 0 | 0 | 0 | 0 | 1.22328 | 5.27567 | 2.6481 |
| | 6/2/2010 | 10 | 6 | Y | 1.58758 | 0 | 0 | 0 | 0 | 1.43926 | 6.93261 | 2.68453 |
| | 6/2/2010 | 10 | 6 | N | 1.59879 | 0.003259 | -0.00014 | -19.6789 | 3.23235 | 0.688315 | 6.54231 | 2.68453 |
| | 6/2/2010 | 10 | 6 | N | 1.58756 | 0 | 0 | 0 | 0 | 1.56856 | 9.59439 | 2.68453 |
| | 6/2/2010 | 10A | 7 | Y | 1.59805 | 0.000545 | -0.00043 | 1.34254 | 4.15309 | 0.297469 | 3.60537 | 2.79839 |
| | 6/3/2010 | 10A | 7 | Y | 1.59897 | 0 | 0 | 0 | 0 | 1.03005 | 5.01798 | 2.79839 |
| | 6/3/2010 | 10A | 7 | N | 1.59798 | 0.000568 | -0.00031 | 1.41807 | 3.73741 | 0.655322 | 6.57651 | 2.79839 |
| | 6/3/2010 | 10A | 7 | N | 1.59906 | 0 | 0 | 0 | 0 | 1.17714 | 8.93736 | 2.79839 |
| | 6/3/2010 | 10B | 7 | Y | 1.6295 | 0.001494 | 0.000432 | -7.29827 | -2.67263 | 0.473324 | 3.17854 | 3.11997 |
| | 6/3/2010 | 10B | 7 | Y | 1.6269 | 0 | 0 | 0 | 0 | 1.07632 | 5.88488 | 3.11997 |

| | | | | | | | | | | |
|---|---|---|---|---|---|---|---|---|---|---|
| 6/3/2010 | 10C | 8 | Y | 1.58721 | 0.000397 | 0.000648 | 2.34071 | -2.94579 | 0.4228 | 2.96398 | 3.31924 |
| 6/3/2010 | 10C | 8 | Y | 1.58866 | 0 | 0 | 0 | 0 | 1.3272 | 6.53133 | 3.31924 |
| 6/3/2010 | 10C | 8 | Y | 1.5944 | 9.04E-05 | 0.000578 | 2.4285 | -5.02623 | 0.723472 | 4.78502 | 3.55606 |
| 6/3/2010 | 10D | 8 | Y | 1.59397 | 0 | 0 | 0 | 0 | 1.27698 | 10.3376 | 3.55606 |
| 6/3/2010 | 10D | 8 | Y | 1.54295 | -8.2E-05 | 0.000133 | 7.42888 | 0.999093 | 1.0139 | 6.32521 | 3.35826 |
| 6/3/2010 | 10E | 8.5 | Y | 1.5448 | 0 | 0 | 0 | 0 | 1.98725 | 10.7442 | 3.35826 |
| 6/3/2010 | 10E | 8.5 | Y | | | | | | | | |

JF-QD, Trial 154

| | 8 | 6 | Y | 1.62776 | 9.11E-05 | -0.00018 | 0.842386 | 4.79516 | 0.25614 | 1.66937 | 2.68961 |
| 9A | 6 | Y | 1.61235 | 0.00025 | 0.000185 | -8.21994 | 0.081817 | 0.265285 | 1.95539 | 2.68983 |
| 10 | 6 | Y | 1.61031 | 0.000308 | -0.000061 | -6.92043 | 3.54937 | 0.250978 | 1.60917 | 2.68109 |

AV2 +4D, Trial 136

| 21 | 6 | Y | 1.57946 | -0.00381 | -0.00182 | -20.19 | -7.45532 | 0.884329 | 5.19746 | 2.61312 |
| 22 | 6 | Y | 1.56483 | -0.00513 | -0.00048 | -23.9479 | 0.27426 | 1.03695 | 23.3104 | 2.63795 |
| 23 | 6 | Y | 1.56809 | 0.001127 | -0.00197 | 6.14745 | -7.90572 | 0.734157 | 5.37127 | 2.50347 |

*FIG. 3(contd)*

METHOD AND APPARATUS FOR DETERMINING A THICKNESS PROFILE OF AN OPHTHALMIC LENS USING A SINGLE POINT THICKNESS AND REFRACTIVE INDEX MEASUREMENTS

RELATED APPLICATIONS

This application claims priority to the U.S. Provisional Application Nos. 61/597,343, filed Feb. 10, 2012, and 61/597,338, filed Feb. 10, 2012, the contents of which are relied upon and incorporated herein.

FIELD OF USE

This invention describes a method and apparatus for a non-contact method of obtaining a thickness profile of at least a portion of one or more ophthalmic lenses. More specifically, the invention provides for ways to measure the transmitted wavefront, center thickness and an approximate refractive index value of a dry free-formed ophthalmic lens to get said thickness profile.

BACKGROUND OF THE INVENTION

It has been known to measure the physical properties of contact lenses using various devices and methods, i.e. optical metrology. Conventionally, optical metrology involves directing an incident beam at an optical object, measuring the resulting diffracted beam, and analyzing the diffracted beam to determine various characteristics, such as the profile of the structure. However, traditional ophthalmic lenses are often made by cast molding, in which a monomer material is deposited in a cavity defined between optical surfaces of opposing mold parts. To prepare a lens using such mold parts, an uncured hydrogel lens formulation is placed between a plastic disposable front curve mold part and a plastic disposable back curve mold part.

The front curve mold part and the back curve mold part are typically formed via injection molding techniques wherein melted plastic is forced into highly machined steel tooling with at least one surface of optical quality.

The front curve and back curve mold parts are brought together to shape the lens according to desired lens parameters. The lens formulation is subsequently cured, for example by exposure to heat and light, thereby forming a lens. Following cure, the mold parts are separated and the lens is removed from the mold parts for said conventional optical metrology. However, the nature of the injection molding processes and equipment make it difficult to form custom lenses specific to a particular patient's eye or a particular application. Consequently, in prior descriptions, methods and apparatus for forming customized lenses via the use of free-form techniques have been described, such as in WO 2009/025848 and WO 2009/025845. An important aspect of these techniques is that a lens is produced in a novel manner where one of two lens surfaces is formed in a free-form fashion without cast molding, lathing or other tooling on top of a forming mandrel.

As described in corresponding free-form disclosures, such as in WO 2009/025848 and WO 2009/025845, a free formed surface and base may include a free flowing fluent media included in the free formed surface. This combination results in a device sometimes referred to as a lens precursor. Fixing radiation and hydration treatments may typically be utilized to convert a lens precursor into an ophthalmic lens.

A freeform ophthalmic lens created in this manner may need to be measured at different states in order to ascertain the physical parameters of the lens and ensure it meets specified convergence design criteria. Therefore, new apparatus and methods are needed for measuring a thickness profile of said free-formed ophthalmic lenses.

SUMMARY OF THE INVENTION

Accordingly, the present invention is directed to apparatus and methods of using a non-contact optical metrology technique to determine a single-point center thickness value of an ophthalmic lens to obtain a thickness profile of at least a portion of an ophthalmic lens at its dry state on a forming mandrel. Utilizing a center thickness value of a lens, a wavefront of a lens measured in transmission, and an approximate refractive index (hereon may be referred to as "RI") value for a lens; a lens thickness profile may be calculated.

A wavefront metrology technique may be used to obtain simultaneous measurements of intensity and phase in one or more continuous measurements. In this disclosure, additional methods of measuring said wavefront, a single point thickness, and RI will be provided. Said methods are exemplary and do not limit the method of using these to obtain a lens thickness profile, the subject matter of this disclosure. Obtaining a lens thickness profile of the generated free-formed ophthalmic device may allow comparison with a design lens thickness profile to determine whether said formed ophthalmic lens meets specified convergence design criteria.

The present invention provides apparatus for providing a lens thickness profile, the apparatus comprising:

a computer processor in digital communication with a digital media storage device, wherein the digital media storage device stores executable software code; and a transmitter in logical communication with the processor and also in logical communication with a communication network;

wherein, the software is executable upon demand and operative with the processor to transmit and receive digital data via the transmitter and to:

receive a transmitted wavefront measurement of a free-formed ophthalmic lens;

receive a thickness measurement descriptive of at least a portion of the free-formed ophthalmic lens;

calculate an estimated refractive index, wherein the RI value is calculated based upon a single point thickness measurement and the wavefront measurement; and calculate a thickness profile based upon the wavefront and an estimated refractive index value.

The thickness profile may be subtracted from a design thickness profile to determine whether the difference value is within a predetermined threshold.

The transmitted wavefront measurement may be received from a source for the wavefront measurement and the source for the wavefront measurement may comprise an emitter functional to emit a wavelength of radiation in a direction towards the ophthalmic device, a sensor functional to detect a reflecting wavelength based upon the emitted wavelength, wherein the reflecting wavelength's intensity and phase will be different based upon physical characteristics of said ophthalmic device, and wherein the processor is in logical communication with one or more of the emitter, the sensor, and the apparatus for the processor, to transmit a logical signal based upon the properties of the free-formed ophthalmic lens.

The sensor may comprise a laser confocal sensor. The emitted radiation may be a high quality light beam with a monochromatic wavelength. The emitted radiation may comprise a monochromatic wavelength of from about 630 nm to about 635 mm.

The apparatus may further comprise a lens cancellation system comprising one or more lenses to collectively cancel a forming optic mandrel's optical effect. The lens cancellation system may be positioned in the optical path between the emitter and the sensor.

The present invention also provides a method of obtaining a lens thickness profile, the method comprising the steps:

measuring a transmitted wavefront measurement of a free-formed ophthalmic lens;

measuring a thickness measurement descriptive of at least a position of the ophthalmic lens;

calculating an estimated refractive index value, wherein the estimated refractive index value is calculated based upon a single point thickness measurement and the wavefront measurement; and calculating a thickness profile based upon the wavefront and an estimated refractive index value.

The method may additionally comprise subtracting a design thickness profile from the calculated thickness profile and determining whether the difference is a value within a predetermined threshold.

The single point thickness may be a single point center of the free-formed ophthalmic lens.

The predetermined threshold may be a programmed design convergence criteria.

One or both of the wavefront measurement and the point thickness measurement may be measured on a dry free formed ophthalmic lens.

In the apparatus and method of the present invention, transmitted wavefront measurements may be obtained by optical digital wavefront metrology techniques. These techniques may be used to obtain simultaneous measurements of intensity and phase of the transmitted wavefront in one or more continuous measurements. Apparatus for measuring a transmitted wavefront includes apparatus comprising:

an optic mandrel for forming an ophthalmic device using free-form technology; said optic mandrel comprising an optical effect;

a lens cancellation system comprising one or more lenses to collectively cancel said optical mandrel's optical effect;

an emitter functional to emit a wavelength of radiation in a direction towards the ophthalmic device;

a sensor functional to detect a transmitted wavefront based upon the emitted wavelength, wherein the transmitted wavefront's intensity and phase will be different based upon a physical characteristic of said ophthalmic device, and a processor in logical communication with one or both of the emitter and the sensor; wherein the processor is programmed to transmit a logical signal based upon the reflecting wavefront's intensity and phase.

As used herein, the term "emitter" may mean "light source".

The optic mandrel, the lens cancellation system, the emitter and the sensor may be aligned. Preferably, the lens cancellation system, the emitter and the sensor are mounted on a rail. The rail may be a vertical rail, preferably a vertical optical rail.

In the apparatus for measuring a transmitted wavefront, the sensor may comprise a digital wavefront camera. The digital wavefront camera may be capable of moving to change or vary continuously a distance along an optical axis of transmission of two or more intensity profiles. The digital wavefront camera may be vibration insensitive. The digital wavefront camera may further comprise a beam splitter to cause a production of a second image at a different position along the optical axis of transmission. Alternatively or in addition, the digital wavefront camera may further comprise one or more magnification lenses dependant on the diaphragm in a light source and the working distance between the light source and the digital wavefront camera.

The apparatus for measuring a transmitted wavefront may further comprise a kinematic mount for placement of said optical mandrel for proper alignment with the lens cancellation system and the emitter. In addition, the apparatus for measuring a transmitted wavefront may further comprise a vacuum for holding the mandrel fixture and the kinematic mount.

The apparatus for measuring a transmitted wavefront may further comprise a top aperture and a bottom aperture, wherein said top aperture is slightly smaller than the bottom aperture and placed on top of the mandrel fixture without contacting said mandrel to create a physical barrier by limiting the light beam passing through defining a boundary condition for a solution of an intensity transport equation. The top aperture may be changed to cover a different field of view. The bottom aperture may also be changed to further improve a dynamic range of measurement.

The lens cancellation system used in the apparatus for measuring a transmitted wavefront may comprise an assembly comprising three lenses inside of a tube, wherein a light beam can pass through each of said lenses. The assembly may be placed perpendicularly to the rail. The light beam may be placed perpendicularly to the rail. The three lens cancellation system may include one or more of: an asphere lens, a plano-convex lens and a plano-concave lens to cancel out one or both of: defocus, and spherical aberrations of the forming optic mandrel which subsequently allows light coming out of the mandrel to be collimated.

The processor may function in real time to generate one or more continuous wavefront measurements of said ophthalmic device.

The emitted radiation may be a high quality light beam with a monochromatic wavelength. The emitted radiation may comprise a monochromatic wavelength of from about 630 nm to about 635 mm.

A method that may be used to obtain wavefront measurements of an ophthalmic device comprises:

aligning an ophthalmic lens wavefront system, taking an optical measurement of a forming optic mandrel and storing that intensity measurement of a forming optic mandrel as an intensity reference file, taking an optical measurement of a forming glass mandrel with a lens that may have been formed on it and storing that intensity file, using software in a processor capable of subtracting one intensity file from at least one other intensity file to obtain a value for an optical wavefront of a lens in real time.

The method to obtain wavefront measurements of an ophthalmic device may further comprise a step of the processor implementing an intensity transport equation and an algorithm. Alternatively or in addition, intensity data may subsequently be converted into an optical wavefront. The optical wavefront may describe a path of light in terms of a light's intensity and phase.

The method to obtain wavefront measurements of an ophthalmic device may comprise any of the apparatus described above for measuring a transmitted wavefront.

BRIEF DESCRIPTION OF THE DRAWINGS

FIG. 3 illustrates exemplary refractive index values for a range of ophthalmic lenses and apertures.

DETAILED DESCRIPTION OF THE INVENTION

Figure 1:
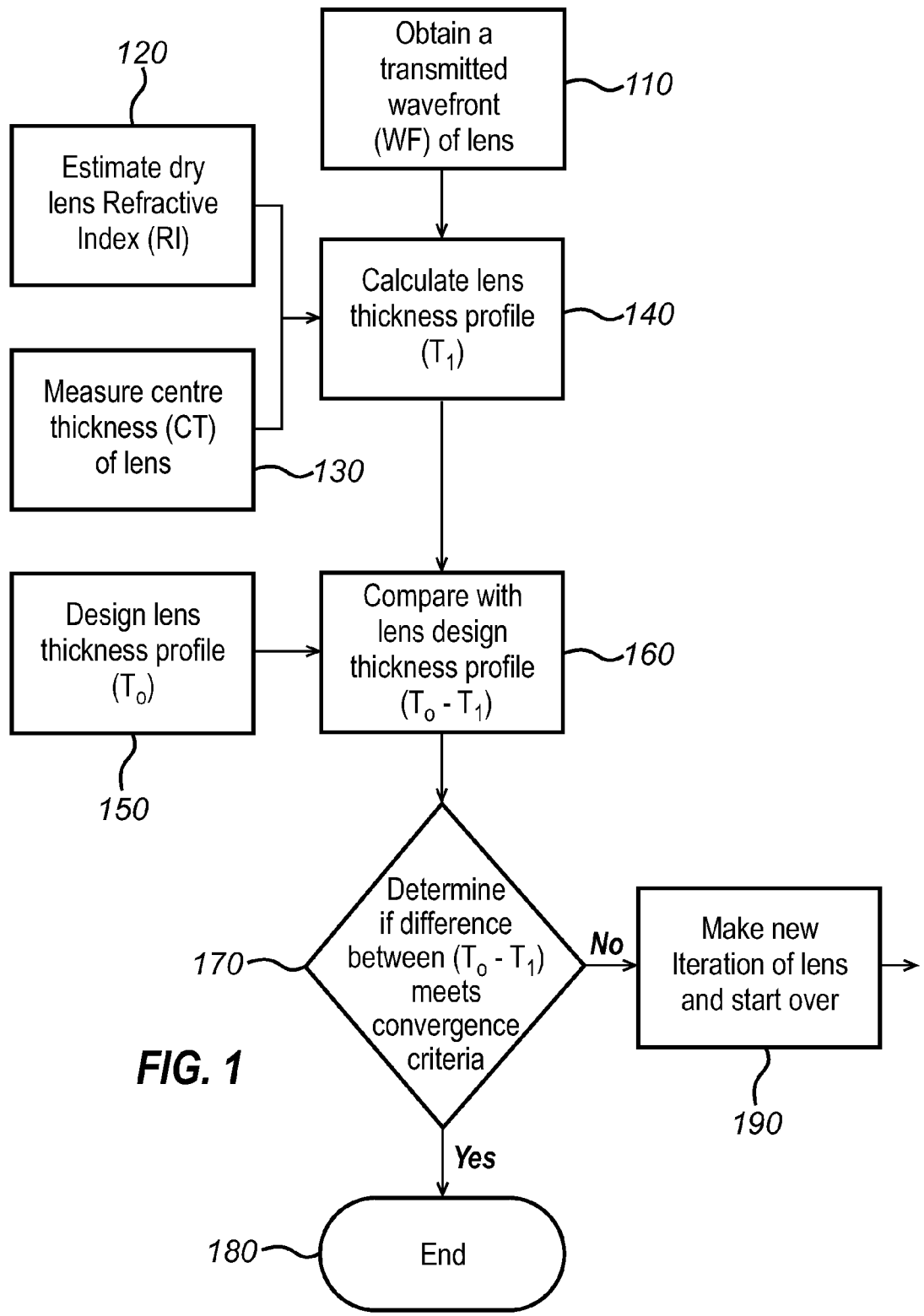
FIG. 1 illustrates method steps that may be used to implement the present invention.

The present invention provides for methods and apparatus for obtaining a lens thickness profile of a free-formed ophthalmic lens. In the following sections, detailed descriptions of the invention will be given. The description of both preferred and alternative embodiments though thorough are exemplary only, and it is understood to those skilled in the art that variations, modifications, and alterations may be apparent. It is therefore to be understood that the exemplary embodiments do not limit the broadness of the aspects of the underlying invention as defined by the claims.

GLOSSARY

As used herein, the term "comprising" encompasses "including" as well as "consisting" and "consisting essentially of" e.g. an apparatus "comprising" X may consist exclusively of X or may include something additional e.g. X+Y.

"Fluent lens reactive media" as used herein means a reactive mixture that is flowable in either its native form, reacted form, or partially reacted form and, a portion or all reactive media may be formed upon further processing into a part of an ophthalmic lens.

"Free-form" as used herein refers to a surface that is formed by crosslinking of a reactive mixture via exposure to actinic radiation on a voxel by voxel basis, with or without a fluent media layer, and is not shaped according to a cast mold, lathe, or laser ablation.

"Lens forming mixture" and sometimes referred as "reactive mixture" or "RMM" (reactive monomer mixture) herein refers to a monomer or prepolymer material which may be crosslinked to form an ophthalmic lens. Lens-forming mixtures may comprise one or more additives such as: UV blockers, tints, photoinitiators or catalysts, and other additives one might desire in an ophthalmic lenses such as, contact or intraocular lenses.

"Lens precursor" as used herein, refers to a composite object consisting of a Lens precursor form and a fluent lens reactive mixture in contact with the lens precursor form. For example, the fluent lens reactive media may be formed in the course of producing a lens precursor form within a volume of reactive mixture. Separating the lens precursor form and adhered fluent lens reactive media from a volume of reactive mixture used to produce the lens precursor form may generate a lens precursor. Additionally, a lens precursor may be converted to a different entity by either the removal of significant amounts of fluent lens reactive mixture or the conversion of a significant amount of fluent lens reactive media into non-fluent, incorporated material.

"Lens precursor form" as used herein, means a non-fluent object with at least one optical quality surface which is consistent with being incorporated, upon further processing, into an ophthalmic lens.

"Lens thickness profile" as used herein refers to a measured set of values that characterize the physical characteristics of a free-formed lens. For example, the thickness profile may comprise mapping the complex spatially varying thicknesses throughout the lens.

"Ophthalmic lens" as used herein and sometimes referred to as "ophthalmic device" or "lens" refers to any ophthalmic device that resides in or on the eye. These devices can provide optical correction or may be cosmetic. For example, the term lens can refer to a contact lens, intraocular lens, overlay lens, ocular insert, optical insert or other similar device through which vision is corrected or modified, or through which eye physiology is cosmetically enhanced (e.g., iris color) without impeding vision. Preferably the ophthalmic lenses may be soft contact lenses made from silicone elastomers or hydrogels, which include but are not limited to silicone hydrogels, and fluorohydrogels.

Measurements of one or more ophthalmic devices may be taken in its unhydrated lens state, and on a mandrel on which, a lens may be formed using free-form technology.

The present invention provides for methods and apparatus for obtaining a single-point center thickness measurement of an object. The single-point center thickness measurement may be obtained using a refractive index ("RI") or a fitted value of $n_1$ and a transmitted wavefront ("WF"), thereby determining a thickness profile of an ophthalmic lens.

A center thickness measurement may be taken of an ophthalmic lens in a dry mandrel state, which may be defined as a residence on a mandrel on which an ophthalmic lens may have been formed, using free form technology.

The apparatus and method of the present invention may include a laser confocal displacement sensor, used to measure a thickness profile of a dry contact lens affixed on a lens forming mandrel. A mandrel fixture may be mounted on top of a kinematic mount. In order to obtain a flat wavefront from an optical glass mandrel, alignment of a metrology apparatus may need to occur. Prior to utilizing the present invention, a calculation to determine RI may have to occur to obtain a RI value.

An estimated dry ophthalmic lens RI may be used as a calibration procedure with respect to a confocal measurement. RI may be referred to as a measure of the speed of light in that substance relative to the speed of light in a vacuum, and may determine by what amount light will be bent when it goes from one medium to another. In a process, a refractive index may be utilized to calculate a thickness profile of a dry contact lens from a transmitted wavefront. Either, a transmitted optical wavefront measurement done on an optical metrology system, or a confocal thickness measurement of an ophthalmic lens may be done first.

Subsequent to obtaining a confocal thickness, measurement of a whole lens thickness ("t") and a transmitted wavefront of a lens ("WF"), an estimated start value of a RI value may be inputted into a computer program. A RI value and a transmitted WF may be used to obtain a thickness profile from a wavefront of an ophthalmic lens ("$WF_t$").

Following obtaining the lens thickness profile, an optimization procedure may used to fit a RI, tilt, and shift, and to minimize error between a difference of a $WF_t$ and a t.

An optimization procedure may include adjustment of one or more of: an x-tilt, a y-tilt, an x-shift, and a y-shift. If an error is a value below a pre-determined threshold between a $WF_t$ and a t, a RI may be accepted as a fitted value of a RI for a data set. This process may repeated for multiple lenses and apertures, in which an average may be calculated for all $n_1$ values combined, to arrive at a fitted value for a dry lens RI ("$n_1$"). A fitted value of $n_1$ may remain a constant value and subsequently be inputted into a computer program, where a fitted value of $n_1$ may remain unchanged.

A fitted $n_1$ value may be used to enable a single-point thickness measurement of a lens ("CT"), such as, for example the single-point center thickness of a lens.

Single point thickness may be measured by a laser confocal sensor first taking a single-point optical measurement at a center of a forming optic glass mandrel without a lens on it. That data may be stored as a reference point. An ophthalmic lens may be made on a same exact forming optic glass mandrel, which may be mounted onto a kinematic mount. A single-point optical measurement of a center of a forming optic glass mandrel may be taken with a lens on it, and that data point may be stored. The two points may be subtracted from each other, thereby determining a center thickness of an ophthalmic lens at a single point.

A fitted $n_1$ value may be used in an equation with a center thickness value to calculate a lens thickness profile from a measured transmitted WF. A lens thickness profile may be compared to a design ophthalmic lens thickness profile by subtracting two profiles from each other, to determine whether an ophthalmic lens meets specified convergence criteria. If not, a new iteration of an ophthalmic lens may be made and a process started over.

Referring now to FIG. 1 illustrates a flow chart that illustrates method steps that may be used to implement the present invention to obtain a thickness profile of an ophthalmic lens. The following steps may include one or more of: obtaining a transmitted wavefront ("WF") for an ophthalmic lens 110; followed by estimating a dry ophthalmic lens RI to get a value for $n_1$ 120; followed by measuring a center thickness of an ophthalmic lens ("CT") 130; followed by calculating a lens thickness profile ($T_1$) 140; followed by comparing a lens thickness profile with a design lens thickness profile ($T_o$) 150 by subtracting two profiles, ($T_o$-$T_1$), from each other 160; followed by determining whether an ophthalmic lens meets a convergence criteria 170. If an ophthalmic lens does meet a convergence criteria, a process may terminate 180, if an ophthalmic lens does not meet a convergence criteria 170, a new iteration of an ophthalmic lens may be made and a process started over 190 until an ophthalmic lens does meet a convergence criteria 170.

Figure 2:
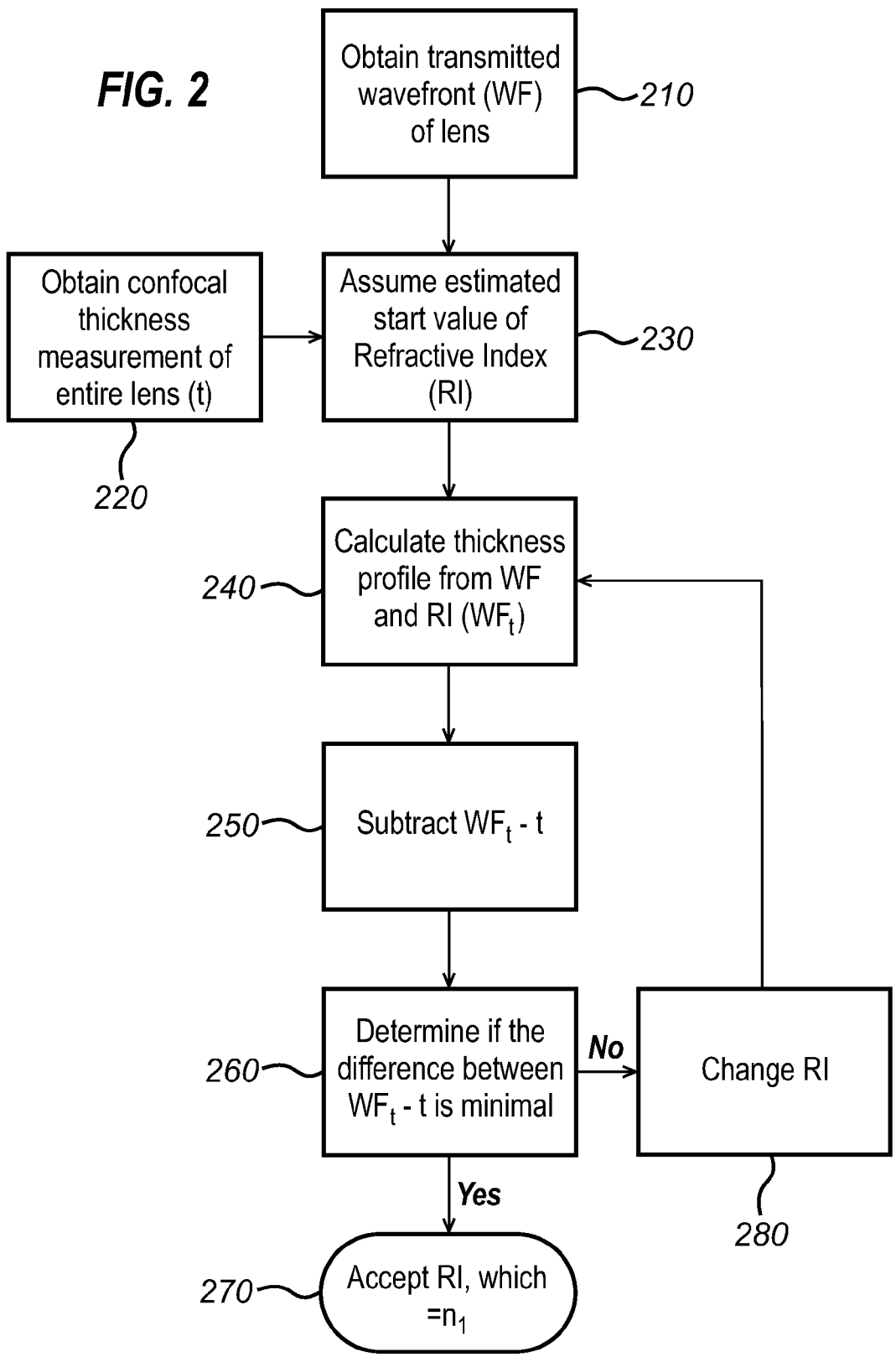
FIG. 2 illustrates additional method steps that may be used to implement the present invention.

Referring now to FIG. 2 represents a flow chart of method steps that may be used to calculate a RI to obtain a value for $n_1$. The following steps may include one or more of: obtaining a transmitted wavefront ("WF") of an ophthalmic lens 210; followed by obtaining a confocal thickness measurement of an ophthalmic lens ("t") 220; followed by assuming a start value of a RI 230; followed by calculating a RI with a transmitted WF of an ophthalmic lens to translate it into wavefront thickness ("$WF_t$") 240; followed by subtracting a t from a $WF_t$ 250; followed by comparing a difference of a t from a $WF_t$ to see if any error may be minimal 260; followed by either accepting a RI and obtaining a value for $n_1$ if error may be minimum 270, or either not accepting a RI if error may be more than minimum, changing a RI 280 and starting a process over. Subsequently, an average RI may be obtained, which may translate a WF of an ophthalmic lens into thickness. It may also be possible to calculate a RI for each pixel of an ophthalmic lens, as opposed to calculating only one number for a RI across a whole surface of an ophthalmic lens.

First, a transmitted lens wavefront may have to be obtained 210 and a confocal thickness measurement of a Lens 220 may have to be obtained. Subsequently, a best guess assumption of a RI start value 230 may be made, which may be any value (e.g., 1, or 1.5). Subsequently, a calculation of a estimated RI with a transmitted Lens WF may be performed to obtain a $WF_t$ of a Lens 240. When calculating a RI, an objective may be to minimize error as much as possible between two data sets, a $WF_t$ and a t. Minimizing error may be done by an optimization procedure to obtain a best fit. Adjusting parameters to fit certain variables so that a difference between two data sets, a $WF_t$ and a t, may be as close to zero as possible, may thereby give a best fit.

Referring now to FIG. 3 is an example of a table of data that illustrates calculation of RI values using a range of different lenses and apertures. There may be four additional parameters that may be included in an optimization procedure that may be fitted to minimize error between a measured thickness and a calculated thickness to get a fitted value for a RI. Some parameters may include one or more of: an x-tilt, a y-tilt, an x-shift, and a y-shift and may be represented on a data table. A purpose of adjusting certain parameters may be to align two thickness maps, a WF and a t, with each other and subsequently take a difference between two thickness maps. This may be important, for example, because otherwise an error between a $WF_t$ and a t may also result from unalignment of a WF and a t.

Referring now again to FIG. 2, subsequent to parameter fit adjustments, at data set may be subtracted from a $WF_t$ data set 250. A quality of a parameter fit may be determined by error, which may be equivalent to root mean square ("RMS"), which may represent a value of a difference between two data sets, a $WF_t$ and a t, and a peak to valley ("PTV") which may represent a PTV difference between a $WF_t$ and a t. Error may be a value below a pre-determined threshold between a $WF_t$ and at 260, and subsequently, a RI may be accepted and represent an $n_1$ value 270. However, error may not be below the threshold and subsequently, a RI start value may be changed 280 along with various parameters, and a RI loop started over.

Repetition of a RI process loop may occur multiple times for a range of ophthalmic lens designs and apertures to obtain several $n_1$ values. An average of all RI values may be obtained for either one or both of, an entire data set in a table, or an average may just be taken of only a certain aperture range. An average of all multiple RI values taken may represent a fitted $n_1$ value, which may remain a constant value and inputted into a computer program, where a fitted value of $n_1$ may remain unchanged. Subsequent to obtaining a fitted $n_1$ value and inputting it into a computer program, a single-point center thickness measurement may be made of an ophthalmic lens by an apparatus of the present invention.

Figure 4:
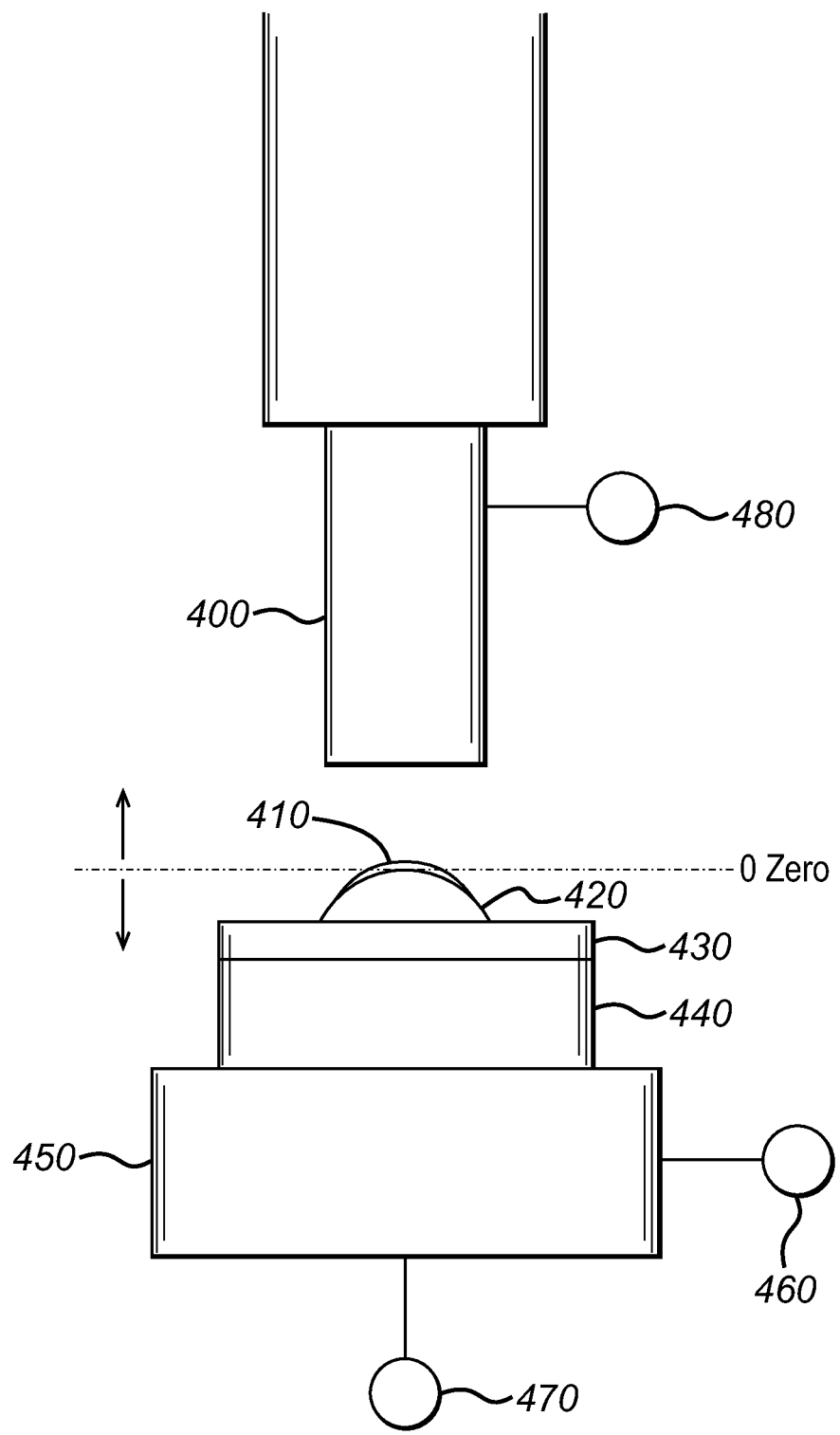
FIG. 4 illustrates apparatus components that may be useful in implementing the present invention comprising laser confocal measurement technology.

Referring now to FIG. 4 represents a front view of a laser confocal sensor measurement system, illustrating some components of an apparatus, including adjusters for a kinematic mount 440 and a sensor 400. Prior to making a measurement, alignment of an apparatus may have to occur to allow centering of a forming optic glass mandrel 420 underneath a displacement sensor 400. Alignment of a confocal displacement sensor 400 may occur so that height of a sensor 400 may be in a correct measurement range.

An apparatus may have various alignment adjusters, which may include one or more of: an x adjuster 460, a y adjuster 470 for a stage 450, and a z adjuster 480 for a sensor 400. An x adjuster 460 and a y adjuster 470 may adjust a center of a kinematic mount 440. A sensor z adjuster 480 may bring a displacement sensor 400 down to a working distance of 30 mm and a measurement range of ±1 mm.

A measurement may be made, subsequent to alignment of an apparatus and sensor 400 brought down to a desired working height. A measurement process may be controlled by a computer program and may include, taking a single-point center measurement of a forming optic glass mandrel 420 (e.g., data of which may serve as a reference point and stored), and taking a single-point center measurement of a lens 410 formed on a glass mandrel 420. Subsequently, reference point data may be subtracted from single-point center measurement of an ophthalmic lens point data thereby, obtaining a center thickness measurement of an ophthalmic lens 410.

Subsequent to obtaining a single-point center thickness measurement, a transmitted WF may be obtained and CT and RI values may be used to calculate a lens thickness profile using algorithms in software used by wavefront sensors, for example, Phaseview's optic smart wavefront sensors, and systems.

Furthermore, a lens thickness profile may be subtracted from a design lens thickness profile to determine if a lens meets specified convergence criteria. A lens may meet specified convergence criteria, and a process may terminate. However, a lens may not meet specified convergence criteria, and a new iteration of a lens may be made and process started over.

Figure 5:
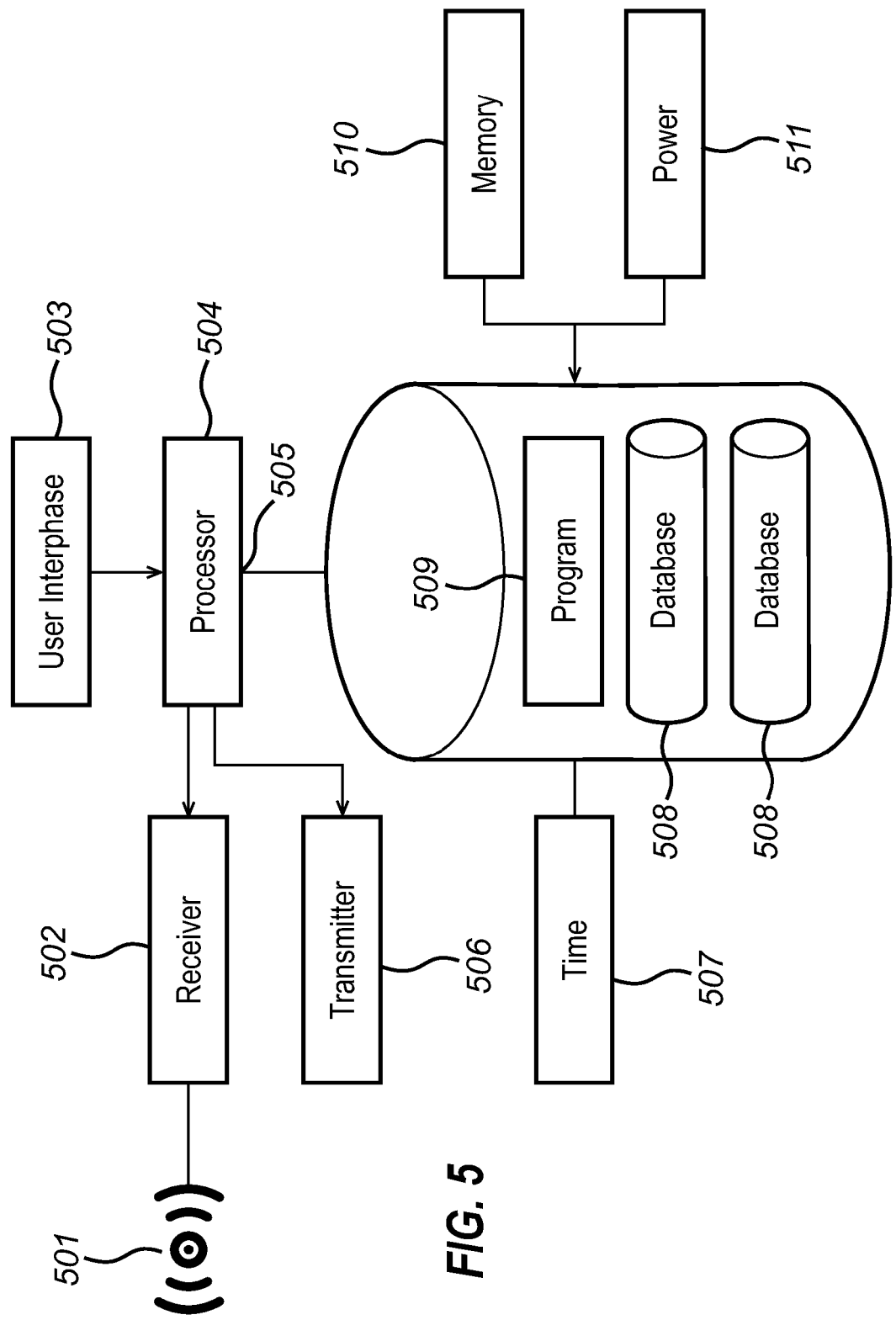
FIG. 5 depicts a schematic of a processor that can be used by the system.

Referring now to FIG. 5, a schematic of the processor that may be used by the system is depicted. The server can contain different means of receiving information 501. For example, Bluetooth technology, network/internet capabilities, etc. A receiver 502 can be used to allow the processor 504 to cause the data to be stored in specific databases 508 in uniform format and time. The data can then be used by a program 509 executable to perform the functions as described above. The server also includes a User interphase 503, a processor for the software 505, a means of power 511, memory 510, and a means of keeping real time 507 in relation to the measurements taken. The server may include a transmitter 506.

CONCLUSION

The present invention, as described above and as further defined by the claims below, provides methods and apparatus for measuring physical characteristics of one or more ophthalmic devices, to obtain a lens thickness profile that may be used to determine whether the ophthalmic lens meets specified convergence design criteria. While the above description contains many specificities, these should not be construed as limitations on the scope of any embodiment or method, but as exemplification of various embodiments thereof. Many other ramifications and variations are possible within the teachings of the various embodiments or methods. Thus, the scope should be determined by the appended claims and their legal equivalents, and not by the examples given.

The invention claimed is:

1. Apparatus for providing a lens thickness profile, the apparatus comprising:
   a computer processor in digital communication with a digital media storage device, wherein the digital media storage device stores executable software code; and
   a transmitter in logical communication with the processor and also in logical communication with a communication network;
   wherein, the software is executable upon demand and operative with the processor to transmit and receive digital data via the transmitter and to:
   receive a transmitted wavefront measurement of a free-formed ophthalmic lens;
   receive a thickness measurement descriptive of at least a portion of the free-formed ophthalmic lens;
   calculate an estimated refractive index, wherein the RI value is calculated based upon a single point thickness measurement and the wavefront measurement; and
   calculate a thickness profile based upon the wavefront and an estimated refractive index value,
   wherein the transmitted wavefront measurement is received from a source for the wavefront measurement and the source comprises an emitter functional to emit a wavelength of radiation in a direction towards the ophthalmic device, a sensor functional to detect a reflecting wavelength based upon the emitted wavelength, wherein the reflecting wavelength's intensity and phase will be different based upon physical characteristics of said ophthalmic device, and
   wherein the processor is in logical communication with one or more of the emitter, the sensor, and the apparatus for the processor, to transmit a logical signal based upon the properties of the free-formed ophthalmic lens.

2. The apparatus of claim 1, wherein the thickness profile is subtracted from a design thickness profile to determine whether the difference value is within a predetermined threshold.

3. The apparatus of claim 2, further comprising a lens cancellation system comprising one or more lenses to collectively cancel a forming optic mandrel's optical effect.

4. The apparatus of claim 3 wherein the lens cancellation system is positioned in the optical path between the emitter and the sensor.

* * * * *